United States Patent
White et al.

(10) Patent No.: US 10,460,969 B2
(45) Date of Patent: Oct. 29, 2019

(54) BIPOLAR ELECTROSTATIC CHUCK AND METHOD FOR USING THE SAME

(71) Applicant: Applied Materials, Inc., Santa Clara, CA (US)

(72) Inventors: John M. White, Hayward, CA (US); Shreesha Y. Rao, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 320 days.

(21) Appl. No.: 15/461,948

(22) Filed: Mar. 17, 2017

(65) Prior Publication Data

US 2018/0053675 A1 Feb. 22, 2018

Related U.S. Application Data

(60) Provisional application No. 62/377,942, filed on Aug. 22, 2016.

(51) Int. Cl.
| | | |
|---|---|---|
| *H01L 21/683* | (2006.01) | |
| *H02N 13/00* | (2006.01) | |
| *H01L 21/67* | (2006.01) | |
| *H01L 21/677* | (2006.01) | |

(52) U.S. Cl.
CPC ...... *H01L 21/6833* (2013.01); *H01L 21/6776* (2013.01); *H01L 21/67103* (2013.01); *H01L 21/67109* (2013.01); *H02N 13/00* (2013.01)

(58) Field of Classification Search
CPC .......... H01L 21/6833; H01L 21/67103; H01L 21/67109; H01L 21/6776; H02N 13/00
USPC ........................................................ 361/234
See application file for complete search history.

(56) References Cited

U.S. PATENT DOCUMENTS

| | | | | |
|---|---|---|---|---|
| 5,870,271 A | * | 2/1999 | Herchen | H01L 21/6838 361/234 |
| 8,238,072 B2 | | 8/2012 | Fujisawa et al. | |
| 2006/0037701 A1 | * | 2/2006 | Koshiishi | H01J 37/32082 156/345.44 |
| 2007/0020903 A1 | * | 1/2007 | Takehara | C23C 14/568 438/592 |
| 2011/0292561 A1 | | 12/2011 | Kamimura et al. | |

(Continued)

FOREIGN PATENT DOCUMENTS

| | | |
|---|---|---|
| TW | 201101413 A | 1/2011 |
| TW | 201527571 A | 7/2015 |

OTHER PUBLICATIONS

Office Action from Taiwan Patent Application No. 106126982 dated Aug. 6, 2018.

(Continued)

*Primary Examiner* — Zeev V Kitov
(74) *Attorney, Agent, or Firm* — Patterson + Sheridan, LLP

(57) ABSTRACT

Described herein are an electrostatic chuck and method for using the same. In one example, an electrostatic chuck is provided that includes a plurality of independently replaceable electrostatic chuck assemblies mounted in an array across a chuck body. The electrostatic chuck assemblies define a substrate support surface suitable for supporting a large area substrate. At least a first electrostatic chuck assembly of the plurality of electrostatic chuck assemblies is operable independent of an operation of a second electrostatic chuck assembly of the plurality of electrostatic chuck assemblies. In yet another example, a method for chucking a substrate is provided.

20 Claims, 10 Drawing Sheets

(56) References Cited

U.S. PATENT DOCUMENTS

| | | |
|---|---|---|
| 2012/0227886 A1 | 9/2012 | Hsiao et al. |
| 2013/0217210 A1 | 8/2013 | Brcka et al. |
| 2015/0343580 A1 | 12/2015 | White et al. |
| 2015/0348812 A1 | 12/2015 | White et al. |
| 2016/0086881 A1 | 3/2016 | Standing |
| 2016/0196997 A1* | 7/2016 | White ............... H01L 21/67718 361/234 |
| 2016/0211162 A1 | 7/2016 | White et al. |

OTHER PUBLICATIONS

International Search Report and Written Opinion for PCT/US2017/045240 dated Nov. 15, 2017.

\* cited by examiner

BIPOLAR ELECTROSTATIC CHUCK AND METHOD FOR USING THE SAME

CROSS-REFERENCE TO RELATED APPLICATIONS

This application claims benefit of U.S. Provisional Patent Application Ser. No. 62/377,942, filed Aug. 8, 2016, which is incorporated by reference in its entirety.

BACKGROUND

Field

Embodiments described herein generally relate to a bipolar electrostatic chuck suitable for use with substrate carriers, substrate supports and the like, for securing substrates during processing.

Description of the Related Art

In the processing of substrates, such as semiconducting substrates and displays, the substrate is held on a substrate support surface of a substrate carrier or substrate support in a process chamber during processing. The a substrate support surface can include an electrostatic chuck (ESC) that has one or more electrodes capable of being electrically biased to hold the substrate to the substrate support surface. Some ESC designs include two or more electrodes that are charged to different voltages to create the charge separation in the substrate supported on the ESC. The charge separation induced in the substrate by the ESC creates an electrostatic chucking force with the oppositely charged electrodes disposed in the ESC, thereby securing the substrate to the substrate support surface of the substrate carrier or substrate support.

In the processing of various display substrates, for example, organic light emitting diode (OLED) displays and the like, a high degree of flatness of the substrate is desired for proper mask alignment. As a result of the substrate being chucked to the substrate carrier and ESC utilizing voltages that may induce arcing between the bipolar electrodes, resulting damage to the ESC and potential release of contamination into the processing environment. Once the ESC is damaged, the entire ESC must be removed from service for costly repairs which usually include replacement of the entire ESC.

Thus, there is a need for an improved bipolar ESC.

SUMMARY

Described herein are an electrostatic chuck and method for using the same, along with seals for retaining backside gas across a substrate support surface and terminal connectors suitable for use in high voltage applications. In one example, an electrostatic chuck is provided that includes a plurality of independently replaceable electrostatic chuck assemblies mounted in an array across a chuck body. The electrostatic chuck assemblies define a substrate support surface suitable for supporting a large area substrate. At least a first electrostatic chuck assembly of the plurality of electrostatic chuck assemblies is operable independent of an operation of a second electrostatic chuck assembly of the plurality of electrostatic chuck assemblies.

In another example, an electrostatic chuck is provided that includes a plurality of electrostatic chuck assemblies that have gaps defined therebetween. The gaps are configured to flow gas across a substrate support surface defined by the electrostatic chuck assemblies.

In another example, an electrostatic chuck is provided that includes a seal supported in a cantilevered orientation that circumscribes a plurality of electrostatic chuck assemblies. The seal is configured to retain backside gas across the electrostatic chuck assemblies.

In another example, an electrostatic chuck is provided that includes a plurality of electrostatic chuck assemblies. Each electrostatic chuck assembly includes at least a first tab extending from a main body. The first tab is routed through the chuck body to facilitate electrical connection to electrodes disposed in the main body of the electrostatic chuck assembly.

In another example, a terminal connector is provided that includes a contact terminal encapsulated in an electrically insulating cover. A portion of the contact terminal is exposed through an opening in a top surface of the cover. The top surface of the cover further includes an outer ring that is disposed radially outward of the opening and an inner ring that is disposed radially inward of the opening.

In another example of the terminal connector described above, the inner ring and the outer ring are sealingly compressed against an insulating portion of a mating electrical connector when the contact terminal is in physical and electrical contact with a conductor of the electrical connector that is circumscribed by the rings.

In another example, an electrostatic chuck is connected to electrical leads using a terminal connector as described herein.

In another example, an electrostatic chuck as described herein is coupled to a stem or is adapted to be transported between processing chambers of a processing system while having a substrate secured thereto.

In yet another example, a method for chucking a substrate is provided. The method includes disposing a large area substrate against a substrate support surface of an electrostatic chuck comprising a plurality of independently replaceable independently energizable bi-polar electrostatic chuck assemblies; energizing at least a first group of the bi-polar electrostatic chuck assemblies to secure the substrate to the substrate support surface; providing a backside gas between the substrate and the substrate support surface; and applying pressure below a seal secured in a cantilevered orientation and circumscribing the bi-polar electrostatic chuck assemblies, the pressure flexing the seal into contact with the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments provided herein relate to a bipolar electrostatic chuck (ESC) suitable for use with substrate carriers, substrate supports and the like, for securing substrates during processing. The ESC includes a plurality of replaceable electrostatic chuck assemblies. Each electrostatic chuck assembly may be independently replaced, thus reducing the time and cost needed to repair the ESC. At least a first electrostatic chuck assembly of the plurality of electrostatic chuck assemblies is operable independent of an operation of a second electrostatic chuck assembly of the plurality of electrostatic chuck assemblies. Thus, some electrostatic chuck assemblies may be configured as spares to be utilized only when other electrostatic chuck assemblies fail, thereby extending the service life of the ESC. In some embodiments, a high voltage terminal connector may be utilized to couple a power source to the electrostatic chuck assemblies. The high voltage terminal connector is configured to prevent arcing, thereby improving the life of the ESC and improving substrate processing yield. In some embodiments, the ESC may include a flexible lip seal for controlling the amount of heat transfer gas escaping from under a substrate chucked to the ESC, thereby improving temperature control of the ESC. Such advantages may be incorporated in a substrate carrier utilized to secure and transport substrates between chambers, such as discussed with reference to FIGS. 1-9 below, and in substrate supports utilized to support one or more substrate within a processing chamber, such as discussed with reference to FIG. 10 below, among other applications. Moreover, the novel flexible lip seal and/or high voltage terminal connector may also be utilized in applications that do not necessarily have at least one electrostatic chuck assembly such as described herein.

Figure 1:
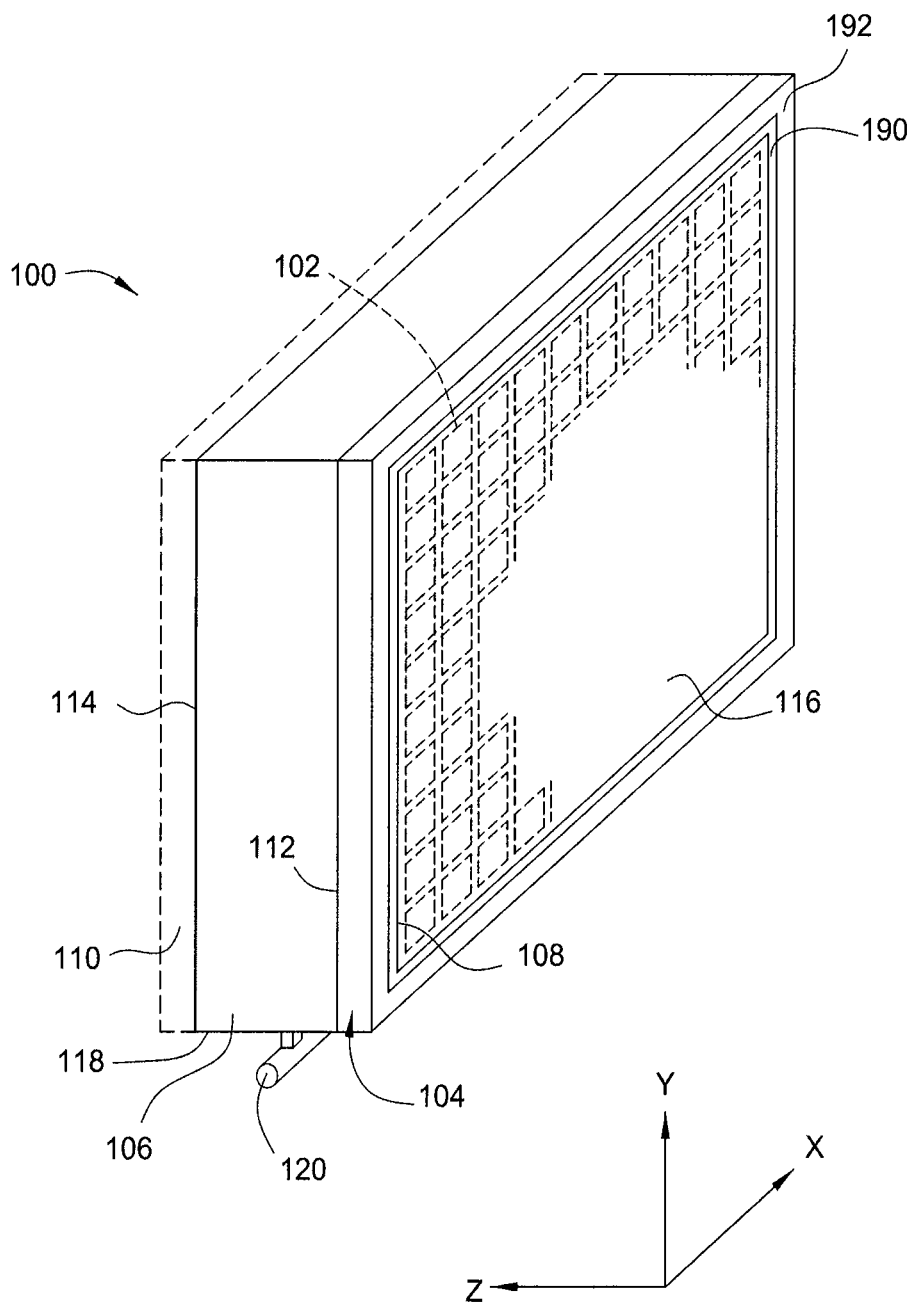
FIG. 1 is a perspective view of a substrate carrier with an integrated electrostatic chuck (ESC) according to one embodiment disclosed herein.

Referring now to FIG. 1, a perspective view of an electrostatic chuck (ESC) 104 integrated with a substrate carrier 100 is shown. The ESC 104 enables the substrate carrier 100 to transport and support a large area substrate while moving between processing and other chambers. In one example, the ESC 104 can be configured to support one or more substrates and may have a substrate support surface 116 of at least 0.174 m$^2$. In general, the size of the substrate support surface 116 of the ESC 104 may be between 1 m$^2$ and about 12 m$^2$, for example, between about 2 m$^2$ and about 9 m$^2$. In other examples, the substrate support surface 116 of the ESC 104 may be adapted for transporting one or more large area substrates, such as substrates having a plan area of about 1.4 m$^2$ and greater.

The substrate may be made from any material suitable for material deposition, such as, for an OLED fabrication processes, among other processes. For example, the substrate may be made from materials such as glass (e.g. soda lime glass, borosilicate glass, etc.), metal, polymer, ceramic, compound materials, carbon fiber material and combinations thereof.

The ESC 104 may be used to transport the substrate during a plasma process, including chemical vapor deposition (CVD) processes, physical vapor deposition (PVD) processes, etching processes, or any suitable plasma or vacuum process, for example, OLED display manufacturing processes. The ESC 104 may also be adapted for use in non-plasma and non-vacuum environments and may be compatible for high temperature applications. Although various embodiments of an ESC 104 are disclosed herein, it is contemplated that electrostatic chucks from other manufacturers may be adapted to benefit from the disclosure provided herein.

The substrate carrier 100 is adapted to transport a substrate in a vertical orientation on the substrate support surface 116 of the ESC 104. The substrate carrier 100 includes the ESC 104, a carrier body 106, an optional backside ESC 110, and an optional translational member 120. When utilized, the backside ESC 110 is used to holds a second large area substrate on the opposite side of the carrier body 106. The backside ESC 110 may be fabricated substantially identical to the ESC 104.

The ESC 104 includes a chuck body 108 and a plurality of independently replaceable electrostatic chuck assemblies 102. The electrostatic chuck assemblies 102 of the ESC 104 form the substrate support surface 116 of the ESC 104. The electrostatic chuck assemblies 102 may be arranged in a Cartesian array (i.e., a 2-dimential array of rows and columns) or other pattern across the substrate support surface 116. Each electrostatic chuck assembly 102 may be independently replaced without disturbing the other electrostatic chuck assemblies 102 of the ESC 104, thereby making repair and reconditioning of the ESC 104 more rapid and less costly.

The chuck body 108 may be made of ceramic or other material, such as aluminum. In some embodiments, the chuck body 108 and carrier body 106 may be fabricated as a single component, and as such, reference to the chuck body 108 and carrier body 106 may be utilized interchangeably. In such embodiments, the electrostatic chuck assemblies 102 are mounted directly to the carrier body 106. The chuck body 108 is disposed on a first surface 112 of the carrier body 106. The optional backside ESC 110 may be disposed on a second surface 114 of the carrier body 106. The second surface 114 of the carrier body 106 is oriented opposite the first surface 112 of the carrier body 106. The optional translational member 120 may be coupled to a bottom surface 118 of the carrier body 106. The bottom surface 118 extends between the first surface 112 and the second surface 114.

Also illustrated on the substrate support surface 116 is a lip seal 192 that circumscribes the array of electrostatic chuck assemblies 102. The lip seal 192 is spaced from the electrostatic chuck assemblies 102 by a gap 190. A gas is provided behind the lip seal 192 and flow through the gap 190 defined between the lip seal 192 and electrostatic chuck assemblies 102. The pressure of the gas behind the lip seal 192 causes the end of the lip seal 192 proximate the gap 190 to flex away from the carrier body 106 and thus make contact with the substrate secured to the electrostatic chuck assemblies 102, thereby substantially confining heat transfer gas between the substrate and electrostatic chuck assemblies 102 forming the substrate support surface 116, and thus increasing the ability to control the temperature of the substrate through the ESC 104.

Figure 2:
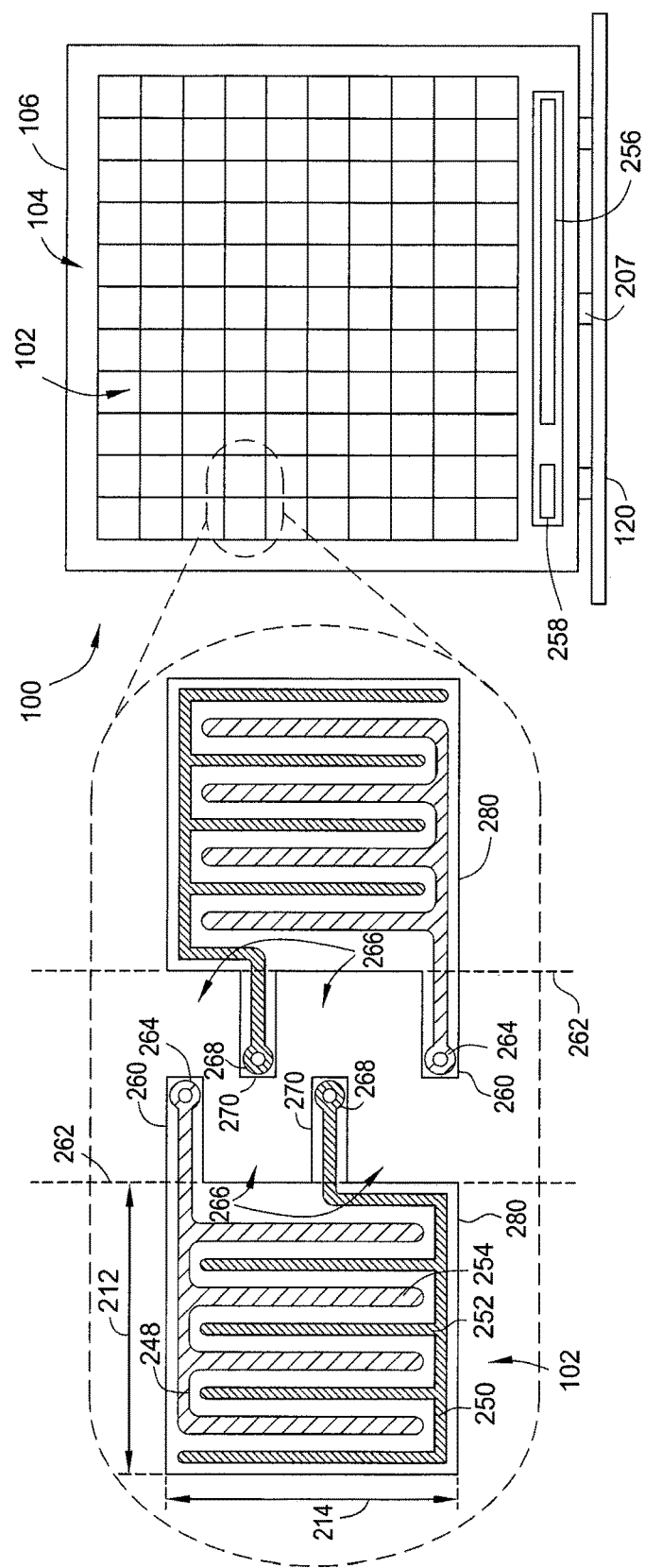
FIG. 2 is a front view of the substrate carrier of FIG. 1.

FIG. 2 illustrates a front view of the substrate carrier 100 of FIG. 1. Each electrostatic chuck assembly 102 of the ESC 104 includes at least two sets of distributed electrodes 248, 250. The electrodes 248, 250 may be arranged in any desired configuration such that the electrodes 248, 250 may be energized a bipolar manner to create an electrostatic force sufficient to secure the substrate to the substrate support surface 116 of the substrate carrier 100. The different sets of electrodes 248, 250 can be equally spaced apart, or arranged in any other desired configuration. For example, the sets of electrodes 248, 250 may be arranged in columns, rows, arrays, or other patterns configured to provide desired chucking characteristics. Each electrode 248, 250 may be charged with different polarities as needed when a voltage is applied thereto, thus generating an electrostatic force. The multiple sets of electrodes 248, 250 may be configured to laterally distribute the electrostatic force across the substrate support surface 116 of the chuck body 108.

In one example, the first electrode 248 may include a plurality of electrode fingers 252 that are interleaved with a plurality of electrode fingers 254 of the second electrode 250. It is believed that the electrode interleaved fingers 252, 254 provide local electrostatic attraction distributed across a large area of the ESC 104 in which the aggregation provides a high chucking force while utilizing less chucking voltage as compared to conventional designs. The electrode fingers 252, 254 may be formed to have different lengths and geometry. In one embodiment, the electrode fingers 252, 254 may have a width of between about 0.1 mm and about 20 mm, for example about 0.25 mm to about 10 mm, which may vary depending upon the material type to be chucked. If desired, electrode fingers 252, 254 may be configured with different sizes interleaved with each other. The electrode fingers 252, 254 may be alternatively and repeatedly formed until a desired number of electrode fingers 252, 254 form a desired pattern.

The electrode fingers 252, 254 of each electrode 248, 250 are generally formed in a main body 280 of each electrostatic chuck assembly 102. A first tab 260 and a second tab 270 extend main body 280. The tabs 260, 270 are shown extending from the same side of the main body 280, but may alternatively extend from opposite or adjacent sides of the main body 280.

The first tab 260 includes a first connection terminal 264 while the second tab 270 includes a second connection terminal 268. The first connection terminal 264 is electrically coupled to the first electrode 248 through the first tab 260 while the second connection terminal 268 is electrically coupled to the second electrode 250 through the second tab 270. Each tab 260, 270 is folded or bent out of the plane of the main body 280 (for example along imaginary line 262) to allow the tabs 260, 270 to penetrate through the body 108 (and optionally the body 106) to a location that facilitates electrical connection to the electrostatic chuck assembly 102 to a power source 258, as further discussed below. The tabs 260, 270 may be spaced to allow the tabs 260, 270 of one electrostatic chuck assembly 102 to interleave with the tabs 260, 270 of an adjacent electrostatic chuck assembly 102 upon assembly to the ESC 104.

Each of the electrostatic chuck assemblies 102 in the ESC 104 may be individually controllable to enable fine tuning of the chucking force provided within a desired region of the ESC 104. Similarly, groups of electrostatic chuck assemblies 102, for example, three electrostatic chuck assemblies 102, may be controllable together. It is contemplated that any number of electrostatic chuck assemblies 102 may be controllable together in any desired pattern or combination. The individual or group control of the electrostatic chuck assemblies 102 within the ESC 104 may be controlled by control electronics 256 and may be adapted to chuck various types of substrates to the carrier 100. Optionally, only a first group of the electrostatic chuck assemblies 102 may be powered to secure a substrate to the ESC 104, thereby allowing a second group of the electrostatic chuck assemblies 102 to function as spare or backup chuck, only energized as needed should one or more of the electrostatic chuck assemblies 102 of the first group fail. For example, once it has been determined that one or more of the electrostatic chuck assemblies 102 of a first group initially utilized to secure a first substrate have failed, one or more of the electrostatic chuck assemblies 102 of a second group initially not energized while the first group is utilized to secure a second substrate may be energized as part of the first group to secure substrates to the ESC 104.

The power source 258 is electrically coupled to the electrodes 248, 250 of the electrostatic chuck assemblies 102 and configured to provide chucking or de-chucking power to the electrostatic chuck assemblies 102 when desired. The power source 258 may also be in electrical communication with control electronics 256. As such, the control electronics 256 may be adapted to control the delivery of electrical signals from the power source 258 independently and selectively to the each of the electrostatic chuck assemblies 102.

The ESC 104 may comprise between about 6 and about 500 or more electrostatic chuck assemblies 102, for example, between about 200 and about 300 electrostatic chuck assemblies 102. In one embodiment, the ESC 104 has about 225 electrostatic chuck assemblies 102 arranged in a 2-D array. In another embodiment, the ESC 104 has about 75 groups of three electrostatic chuck assemblies 102. Although shown as arranged in a grid-like pattern, the ESC array 202 may be configured in any shape or pattern on the body 204 to accommodate desired chucking capabilities.

The main body 280 of the electrostatic chuck assemblies 102 included in the ESC 104 is depicted as having a square or rectangular plane form (i.e., shape), however, it is contemplated that the main body 280 may have other shapes. In one embodiment, a width 212 of the main body 280 may be between about 100 mm and about 200 mm, such as between about 150 mm and about 175 mm. A length 214 of the main body 280 may be between about 100 mm and about 200 mm, such as between about 140 mm and about 150 mm. The length 214 and width 212 may also have other sizes and shapes.

An area occupied by the main body 280 of the ESC 104 may correlate to a size of the carrier body 106 and may cover substantially the entire body 106 or only a portion of the carrier body 106. As depicted, the ESC 104 covers a portion of the carrier body 106. In one embodiment, a width 208 of the ESC 104 may be between about 1000 mm about 3000 mm, such as between about 2000 mm and about 2500 mm. A length 210 of the ESC 104 may be between about 1000 mm about 3000 mm, such as between about 2000 mm and about 2500 mm. However, as previously mentioned, the size of the ESC 104 will generally correspond to the size of the carrier body 106.

As previously described, the carrier body 106, which has the ESC 104 disposed thereon, may have the control electronics 256, power source 258, and optional translational member 120 coupled thereto. The carrier body 106 may be fabricated from a metal, such as aluminum, titanium, stainless steel, and alloys and combinations thereof. The carrier body 106 may be square shaped or rectangular shaped, however, it is contemplated that the carrier body 106 may have other shapes.

The power source 258, such as a battery or the like, may be coupled to the carrier body 106 and be configured to store and provide power to the ESC 104. In one embodiment, the power source 258 and the control electronics 256 are coupled to the carrier body 106 adjacent the ESC 104. In another embodiment, the power source 258 may be located remotely from the carrier body 106 but in electrical communication with the ESC 104 and the control electronics 256. For example, the power source 258 may be located within a processing chamber and may be electrically coupled to the ESC 104 and control electronics 256 when it is desirable to chuck and de-chuck a substrate from the carrier 100 using quick disconnects, inductive coupling or other suitable technique.

In operation, one or more substrates may be placed in contact with the carrier 100 and the control electronics 256 may cause the power source 258 to provide a chucking voltage having a first polarity to the electrodes 248 and a chucking voltage having a second polarity to the electrodes 250 in one or more electrostatic chuck assemblies 102 disposed within the ESC 104. The ESC 104 chucks the substrate for a desired amount of time (i.e. during processing) and the control electronics 256 may then cause the power source 258 to provide a de-chucking voltage of the opposite polarities to de-chuck the substrate from the carrier 100. In one embodiment, sensors disposed within the processing chamber may be in communication with the control electronics 256 and provide signals to the control electronics 256 when it is desirable to chuck and/or de-chuck the substrate. Although the power source 258 and the control electronics 256 are shown as being coupled to the carrier body 106 below the ESC 104, it is contemplated that the power source 258 and the control electronics 256 may be coupled to or disposed in the carrier body 106 at any desirable location, for example, above the ESC 104 or beside the ESC 104.

The optional translational member 120 may be coupled to the carrier body 106 by one or more coupling elements 207. The coupling elements 207 may be formed from a material similar to the materials utilized to form the body 160 or may be formed from various other materials. The coupling elements 207 extend from the body 160 and position the translational member 120 relative to the carrier body 106. The optional translational member 120 may be adapted to move within a processing chamber along a guide or the like. The optional translational member 120 may be rod-like and may have a circular or quadrilateral cross-section. In one embodiment, the optional translational member 120 and coupling elements 207 may be electrically conductive to provide electrical communication between the control electronics 256/ESC 104 and the power source 258 if the power source is located remotely from the carrier body 106.

Figure 3:
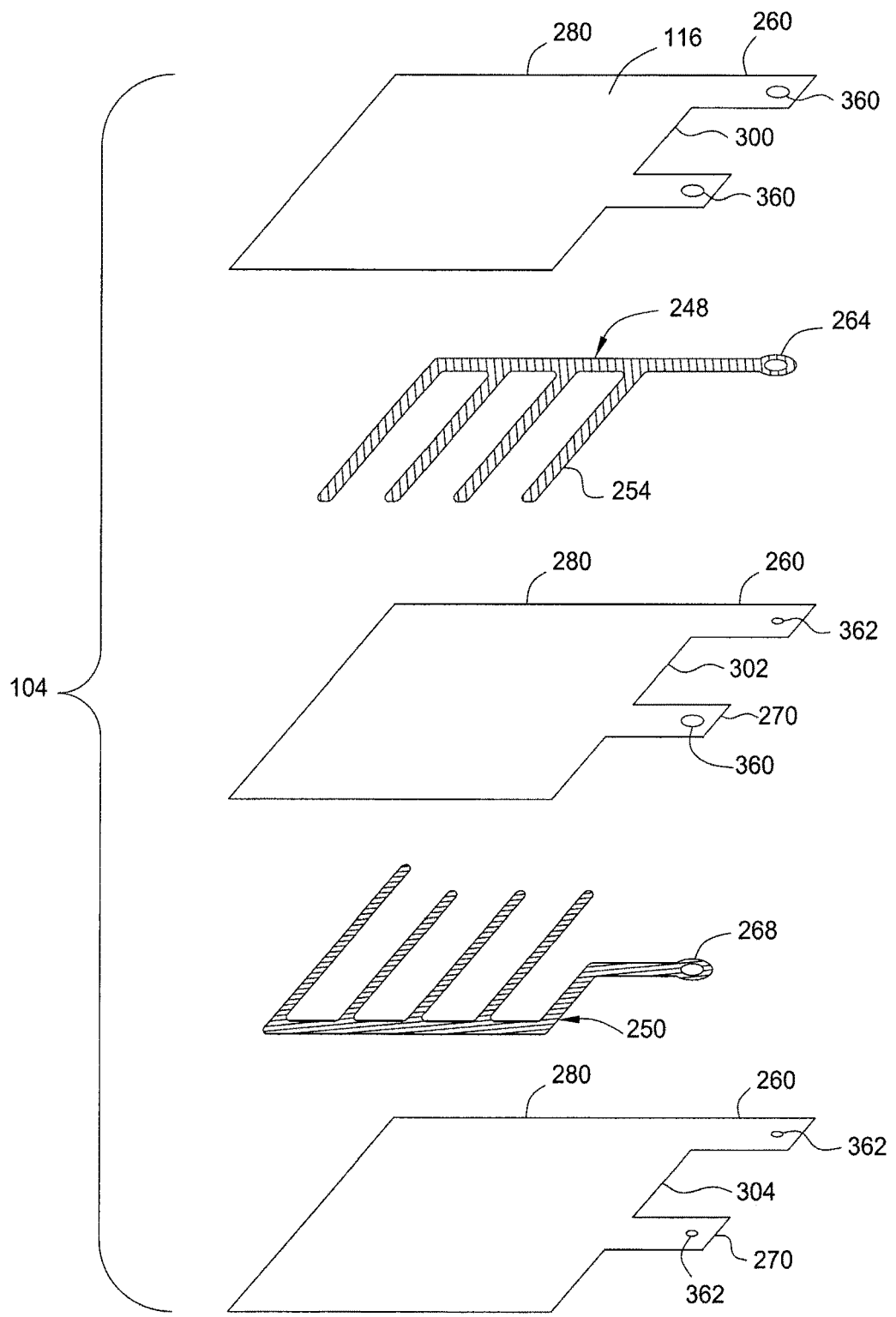
FIG. 3 is an exploded view of an electrostatic chuck assembly of the ESC of FIG. 1.

FIG. 3 is an exploded view of one of the electrostatic chuck assemblies 102 of the ESC 104. The electrostatic chuck assembly 102 includes a first insulating layer 300, a second insulating layer 302 and a third insulating layer 304. The first electrode 248 is sandwiched between the first insulating layer 300 and the second insulating layer 302. The second electrode 250 is sandwiched between the second insulating layer 302 and the third insulating layer 304. The layers 300, 302, 304 may be formed from an electrically insulating polymeric material, such as polyimide or polyaryletherketone, for example, polyetheretherketone (PEEK). The layers 300, 302, 304 may be held together by adhesive, thermal bonding or other suitable method.

The insulating layers 300, 302, 304 include first portions that align upon assembly to define the tab 260. The insulating layers 300, 302, 304 also include second portions that align upon assembly to define the tab 270. The first portion of the tab 260 formed in the first insulating layer 300 has a hole 360. The portions of the tab 260 formed in the second and third insulating layers 302, 304 have a hole 362 that exposes the surface of the metal conductor defining the terminal end of the first connection terminal 264. The hole 362 is concentric with and larger than the hole 360. The holes 360, 362 align to allow a fastener, as further discussed below, to pass through the tab 260 when making electrical connection to the electrode 248. The first portion of the tab 270 formed in the first and second insulating layers 300, 302 have a hole 360, while the first portion of the tab 270 formed in the in the third insulating layer 304 have a hole 362. The hole 362 exposes the surface of the metal conducts defining the terminal end of the second connection terminal 268. Similar to the tab 260, the hole 362 is concentric with and larger than the hole 360, while the holes 360, 362 align to allow a fastener, as further discussed below, to pass through the tab 270 when making electrical connection to the electrode 250.

Figure 4:
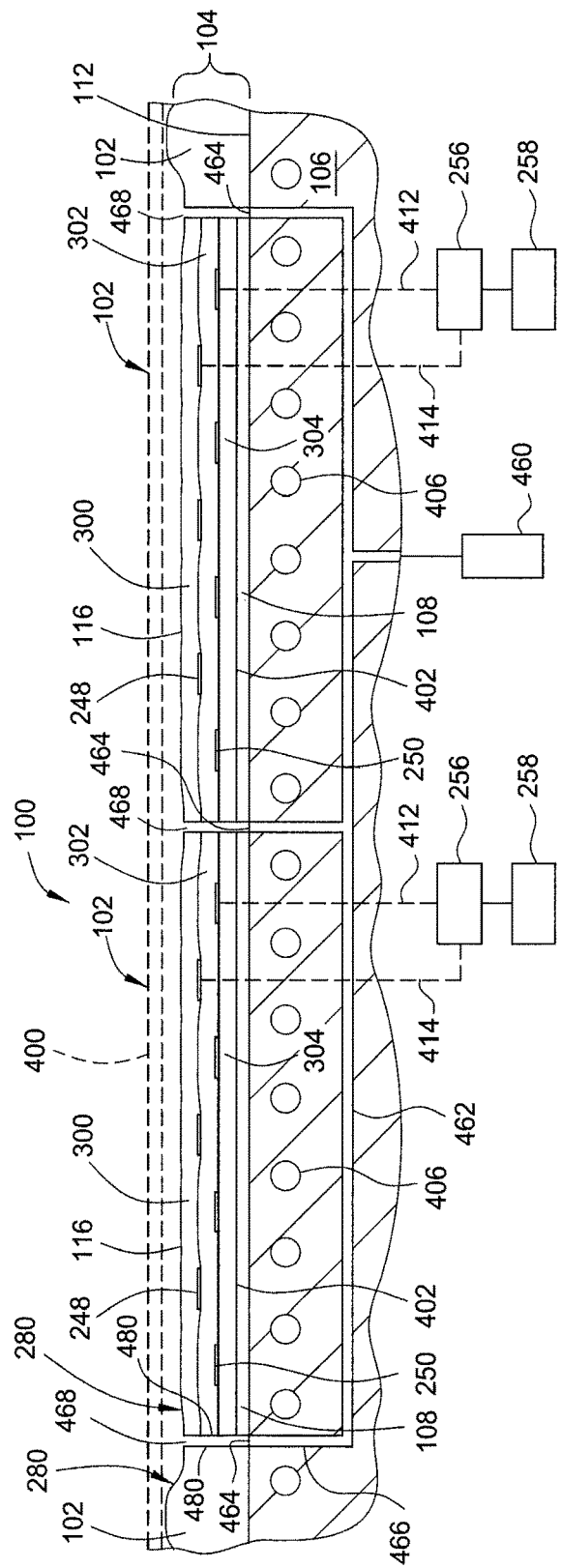
FIG. 4 is a partial cross-sectional view of the substrate carrier illustrating adjacent electrostatic chuck assemblies.

FIG. 4 is a partial cross-sectional view of the substrate carrier 100 illustrating adjacent electrostatic chuck assemblies 102. A substrate 400 is shown in phantom disposed on the substrate support surface 116 of the electrostatic chuck assemblies 102. The substrate 400 may be configured as described above. The electrostatic chuck assemblies 102 may be mounted to an upper surface 402 of the chuck body 108 (if present) utilizing pressure sensitive adhesive, or other suitable method. The electrostatic chuck assemblies 102 (and chuck body 108, if present) may be mounted to the carrier body 106 utilizing pressure sensitive adhesive, or other suitable method. The electrodes 248, 250 of each electrostatic chuck assembly 102 are coupled to the control electronics 256 and power source 258 by electrical leads 412, 414, as further discussed below with reference to FIGS. 6 and 7.

Continuing to refer to FIG. 4, facing edges 480 of two or more adjacent main bodies 280 of the electrostatic chuck assemblies 102 are spaced apart thereby forming a gap 468 between the electrostatic chuck assemblies 102. There optionally may be no gaps 468 present between selected other adjacent electrostatic chuck assemblies 102. The gaps 468 form gas channels between the electrostatic chuck assemblies 102 across the substrate support surface 116 of the ESC 104. By selecting between which electrostatic chuck assemblies 102 have gaps 468 and do not have gaps 468, a pattern of gas channels may be formed across the substrate support surface 116. The gas channels defined by the gaps 468 may be flooded with a backside gas, such as He, to improve heat transfer between the ESC 104 and the substrate 400 secured thereto. By selecting which electrostatic chuck assemblies 102 have gaps 468 formed therebetween, the pattern of the gas channels may be configured as desired.

The carrier body 106 includes one or more ports 464 that are coupled though passages 466, 462 formed through the carrier body 106 to a backside gas source 460. The backside gas source 460 may be disposed inside the carrier body 106, or temporarily coupled thereto while in a processing chamber, for example using a quick connect or other fitting (not shown).

The one or more ports 464 are aligned with the gaps 468 forming the gas channels between the electrostatic chuck assemblies 102. Thus, backside gas, such as He, may be provided from backside gas source 460 through the ports 464 and into the gaps 468 to enhance temperature control of the substrate 400. As the gas channels are formed by the gaps 468 defined between the electrostatic chuck assemblies 102, separate gas channels do not have to be formed in the substrate support surface 116, thereby reducing fabrication costs. However, it is also contemplated that features may be formed on the surface of the substrate support surface 116 to enhance the distribution of the backside gas across the surface of the ESC 104. Additionally, as the electrostatic chuck assemblies 102 may be repositioned on the carrier body 106 to reconfigure the pattern of gas channels defined by the gaps 468, the heat transfer characteristics of the ESC 104 may be easily modified to tailor heat transfer needs to specific applications without having to replace major portions of the ESC 104.

To further enhance heat transfer between the ESC 104 and the carrier body 106 and ultimately to with the substrate 400, the carrier body 106 may optionally include conducts 406 disposed therein for carrying a heat transfer fluid. The conducts 406 are arranged in a pattern laterally across the carrier body 106 (i.e., parallel to a plane of the ESC 104). The heat transfer fluid may reside in the conducts 406 or be circulated therethrough. In one example, the heat transfer fluid provided from a fluid source (not shown) is circulated the conducts 406. In another example, the heat transfer fluid sealingly contained the conducts 406 while substrate 400 is secured to the carrier 100. The fluid source may be disposed inside the carrier body 106, or temporarily coupled thereto, for example using a quick connect or other fitting (not shown), for flowing or exchanging the heat transfer fluid.

Figure 5:
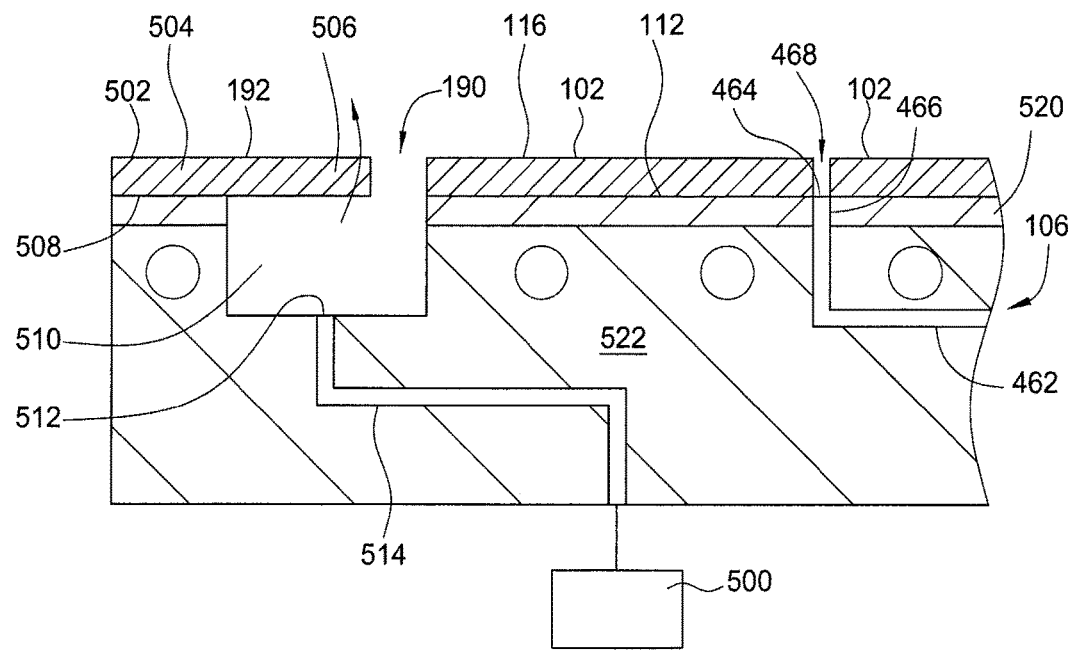
FIG. 5 is another partial cross-sectional view of the substrate carrier.

FIG. 5 is another partial sectional view of carrier 100 depicting the lip seal 192 in greater detail. The lip seal 192 is a flexible strip of material, such as a polymer. In one embodiment, the lip seal 192 and insulating layer 300 are formed from the same type of material.

The lip seal 192 has top surface 502 and a bottom surface 508. The top surface 502 may be coplanar with or slightly below the top surface of the electrostatic chuck assemblies 102.

The lip seal 192 also has a support portion 504 and an unsupported portion 506. The support portion 504 lip seal 192 is coupled to the first surface 112 of the carrier body 106. In one example, the bottom surface 508 of the lip seal 192 below the support portion 504 is coupled by an adhesive to the first surface 112 of the carrier body 106.

The first surface 112 of the carrier body 106 includes a channel 510 disposed below the unsupported portion 506. The presence of the channel 510 allows the unsupported portion 506 to extend from the first surface 112 of the carrier body 106 over a portion of the channel 510 in a cantilevered orientation that allows the unsupported portion 506 to flex upwards away from the carrier body 106 and into contact with the bottom surface of the substrate (400) upon application of gas to the channel 510, as illustrated by the arrow shown in FIG. 5.

The amount or pressure of gas provided to the channel 510 may be controlled in a manner that advantageously allows the force applied by the unsupported portion 506 flexing upwards against the bottom surface of the substrate to be precisely controlled. The control of the force of the lip seal 192 against the substrate allows the pressure of the backside gas present beneath the substrate to be controlled without compromising the chucking force provided by the ESC 104 at the edge of the substrate.

One or more ports 512 are formed in the carrier body 106 connecting the channel 510 to a fluid source 500 via a passage 514 formed through the carrier body 106. The fluid source 500 may be the same or different than the gas source 460 providing backside gas below the substrate. The fluid source 500 may be disposed inside the carrier body 106, or temporarily coupled thereto, for example using a quick connect or other fitting (not shown).

In one embodiment, the gap 190 formed between the lip seal 192 and electrostatic chuck assemblies 102 may optionally be open to one or more of the gaps 468 formed between adjacent electrostatic chuck assemblies 102. In this configuration, the fluid source 500 may provide backside gas such as He which flows out of the channel 510 through the gap 190 and into the pattern of backside gas channels formed by the gaps 468 defined between electrostatic chuck assemblies 102 thereby reducing the need for additional backside gas passages and ports through the ESC 104 and/or carrier body 106.

Figure 6:
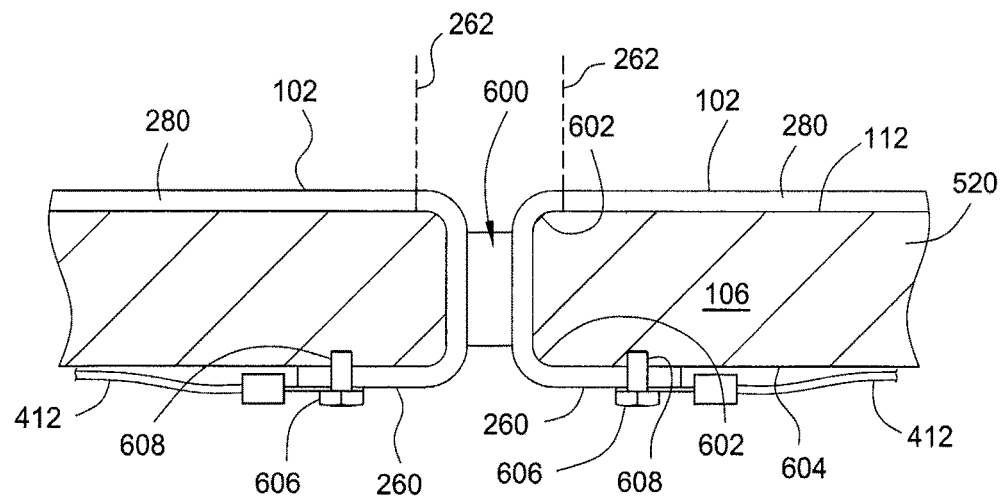
FIG. 6 is another partial cross-sectional view of the substrate carrier illustrating electrical connections of the ESC.

FIG. 6 is a partial sectional view of the carrier 100 detailing the electrical connection between the electrostatic chuck assemblies 102 and leads 412. Although not shown, the leads 414 are similarly connected to the other electrode of each respective electrostatic chuck assembly 102.

The tab 260 of each electrostatic chuck assembly 102 is routed from the first surface 112 of the carrier body 106 to a bottom surface 604 of the carrier body 106 through an aperture 600 formed through the carrier body 106. The aperture 600 through the carrier body 106 may be in the form of a slit that allows one or more of the tabs 260 and/or tabs 270 (not shown in FIG. 6) from one or more of the electrostatic chuck assembly 102 to pass through. A fastener 606 is utilized to couple the tab 260 to both the lead 412 and the carrier body 106 by engaging with a threaded hole 608 formed in the carrier body 106.

Figure 7:
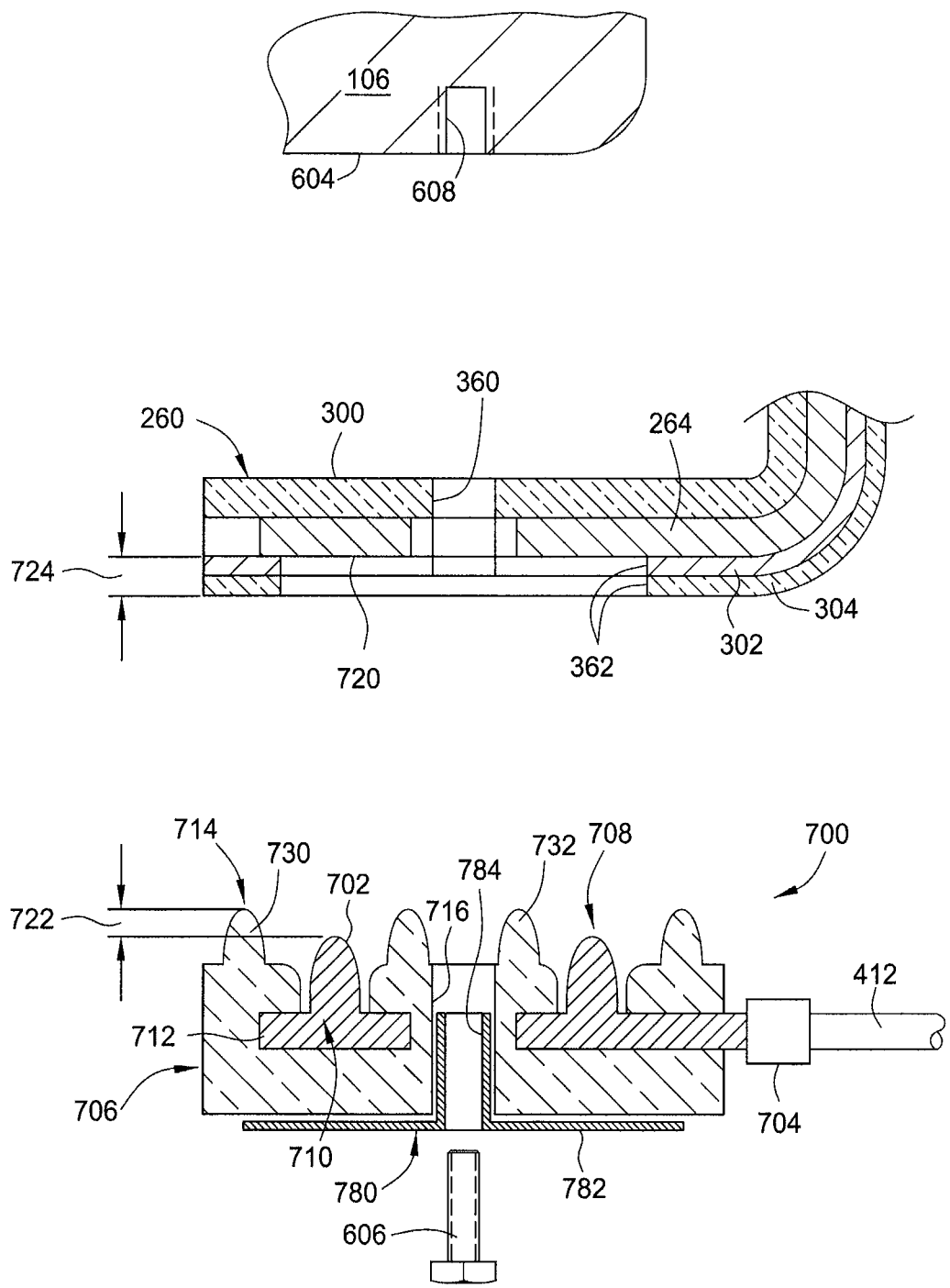
FIG. 7 is an exploded view of a portion of the ESC and electrical connector.

Referring now to the exploded sectional view of FIG. 7, the lead 412 is coupled to a terminal connector 700. In one embodiment, the electrical conductor within the lead 412 is coupled to a contact terminal 710 of the terminal connector 700 by a crimp 704 or other suitable connection, such as a solder or solderless connection. The lead 414 is similarly connected by another terminal connector 700 to the other tab 270.

The contact terminal 710 includes a ring-shaped base 712 having a contact 702 projecting from an upper side. The contact 702 may be a plurality of bumps or ridges, and in one embodiment, is an annular rib.

The contact terminal 710 is substantially encapsulated by a resilient electrically insulating cover 706. The insulating cover 706 may be fabricated from silicone or other suitable material. The insulating cover 706 includes a central hole 716 to allow passage of the fastener 606 (illustrated in FIG. 6). The ring-shaped base 712 is generally concentric with the central hole 716, thereby also allowing passage of the fastener 606. The ring-shaped base 712 may also be isolated form the central hole 716 by the material comprising the cover 706.

A top surface 714 of the cover 706 includes an annular opening 708. The contact 702 of the contact terminal 710 is exposed through the annular opening 708. The top surface 714 of the cover 706 also includes an inner ring 732 and an outer ring 730 that project away from the contact terminal 710. The inner ring 732 is disposed radially inward of the annular opening 708 while the outer ring 730 is disposed radially outward of the annular opening 708.

The top of the contact 702 is recessed a distance 722 below the top surface 714 of the cover 706. The distance 722 is selected such that when the terminal connector 700 is fastened to the bottom 604 of the carrier body 106, the resilient material of the cover 706 compresses to allow the contact 702 to contact the exposed bottom surface 720 of the first connection terminal 264 that is recessed a distance 724 from the exterior surface of the insulating layer 304 comprising the tab 260.

A compression washer 780 may be utilized to control the compression of the cover 706. The compression washer 780 includes a flat disk-shaped ring 782 having a boss 784 projecting coaxially from the ring 782. The length of the boss 784 is selected to ensure the contact 702 seats firmly against the exposed bottom surface 720 of the first connection terminal 264 without over compressing the cover 706. The boss 784 may be comprised of an electrically insulating material to prevent arcing between the first connection terminal 264 and the fastener 606 extending through the boss 784 and engaging with the threaded hole 608 of the carrier body 106.

Once the terminal connector 700 is fastened to the bottom 604 of the carrier body 106, the compressed outer ring 730 projecting from the top surface 714 of the cover 706 disposed radially outward of the contact 702 makes a robust seal with the insulating layer 304 of the tab 260. The compressed outer ring 730 prevents arcing between the contact terminal 710 and objects outward of the cover 706. Additionally, the compressed inner ring 732 projecting from the top surface 714 of the cover 706 makes a robust seal with the insulating layer 300 of the tab 260, thereby preventing arcing between the terminal 710 from the fastener 606. The reduction in arcing extends the life of the electrostatic chucking assemblies 102, but also reduces the cost associated with preventative maintenance and poor production yields associated with arcing-generated particulate contamination.

The disk-shaped ring 782 of the compression washer 780 may be fabricated from a relatively stiff material, such as the material comprising the boss 784. The outside diameter of the disk-shaped ring 782 may be selected to accommodate the head of the fastener 606 (and optional washer not shown) and to adequately spread the compression force provided by the fastener 606 across the cover 706 to ensure good compression of the outer ring 730, thus enhancing arcing protection.

Figure 8:
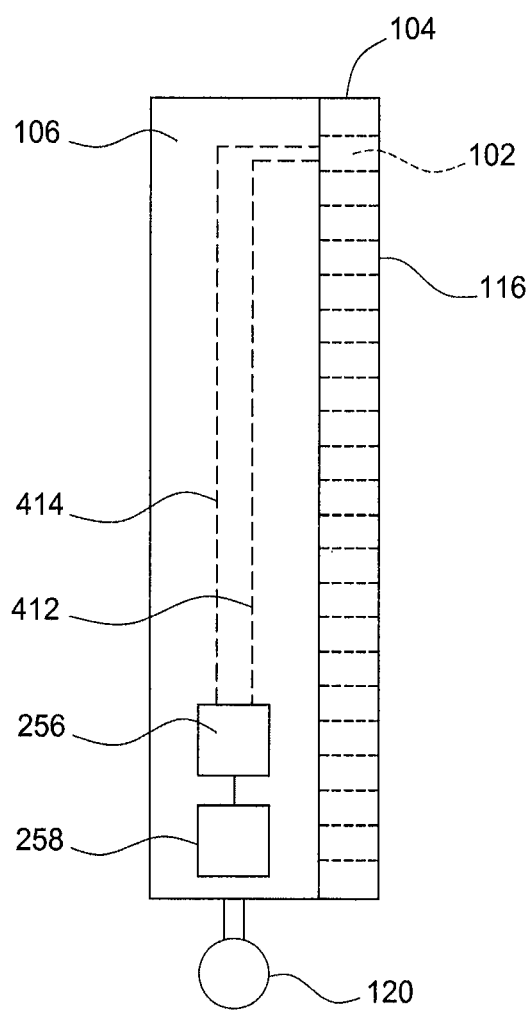
FIG. 8 is a side view of the substrate carrier of FIG. 1.
Figure 9:
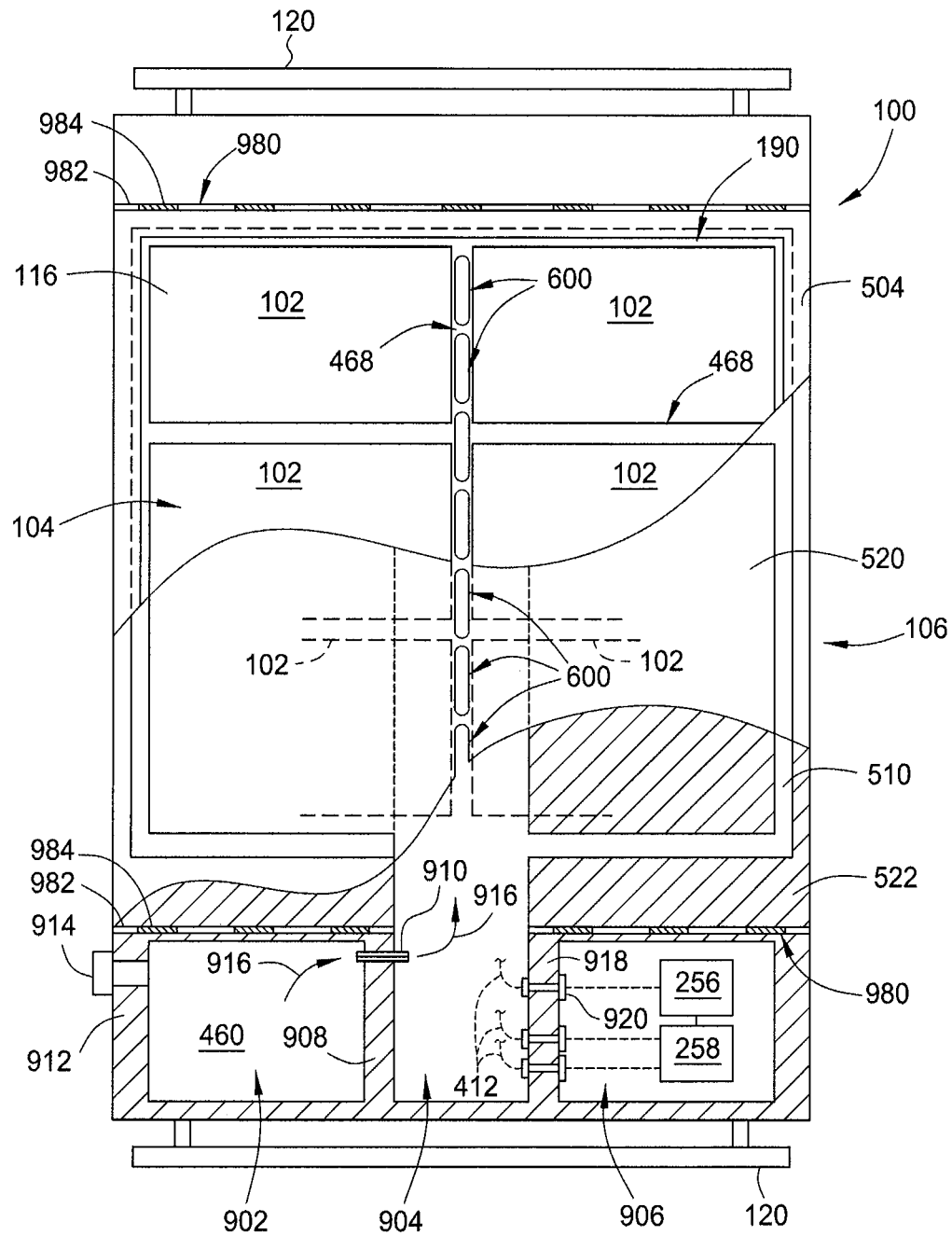
FIG. 9 is a cutaway view of a substrate carrier.

FIG. 8 illustrates a side view of the substrate carrier 100 of FIG. 1. Each of the electrostatic chuck assemblies 102 or groups of the electrostatic chuck assemblies 102 are electrically coupled to the control electronics 256 and the power source 258 (not shown in the side view) via the leads 412, 414. Only one pair of leads 412, 414 are depicted coupling a single electrostatic chuck assembly 102 for the sake of simplicity, but the number of leads 412, 414 are as many as necessary to individually control each electrostatic chuck assembly 102 or groups of electrostatic chuck assemblies 102 included in the ESC 104. In the illustrated embodiment, the leads 412, 414 may be routed along a side surface of the carrier body 106. In another embodiment, the leads 412, 414 may be routed through the carrier body 106 to the control electronics 256.

Figure 10:
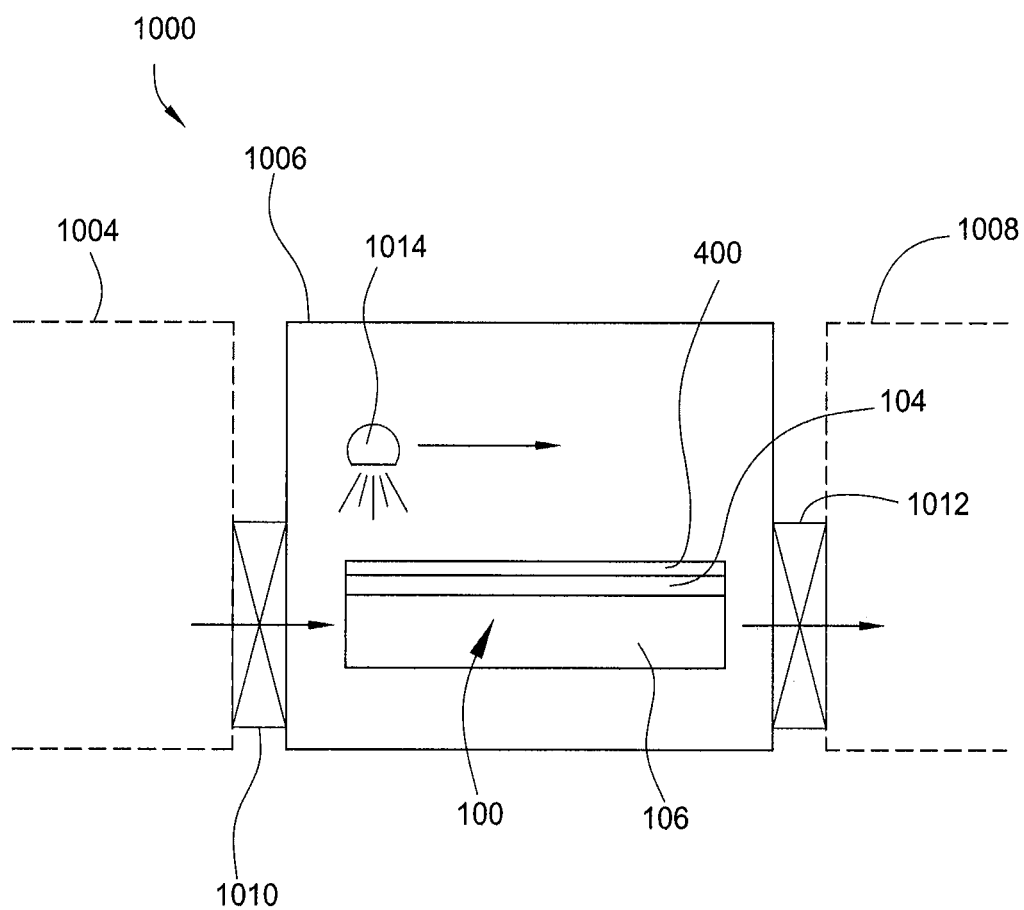
FIG. 10 is a partial schematic view of a processing system utilizing the substrate carrier of FIG. 1 to transport substrates through the processing system.

FIG. 10 is a schematic top view of the substrate carrier 100 of FIG. 1 in a processing system 1000. The processing system 1000 carries a substrate 400 through different chambers/modules 1004, 1006, 1008 of the processing system 1000. The processing system 1000 may be configured for deposition, etch, implantation, annealing or other processes. In one embodiment, the processing chamber 1006 may house a deposition material source 1014 for depositing materials on the substrate 400. In one embodiment, the deposition material source 1014 may be a spray bar that deposits on the substrate 400 using a thermal evaporation technique performed in a vacuum within the processing chamber 1006. For example, the deposition material source 1014 may be configured to deposit materials suitable for OLED device fabrication, such as organic materials. Some organic materials suitable for OLED fabrication include organometallic chelates (for example Tris(8-hydroxyquinolinato)aluminum (Alq3)), fluorescent and phosphorescent dyes and conjugated dendrimers. In other embodiments, the deposition material source 1014 may be a PVD target, such as a cylindrical target that provides materials for depositing conductive and reflective coatings on substrates, for example such as used in the flat panel display, architectural glass, and solar industries.

The substrate carrier 100 with the substrate 400 disposed thereon may first enter a first vacuum and/or processing chamber, such as a first load lock chamber 1004, where the internal pressure of the chamber 1004 is reduced to a desired degree of vacuum. The carrier 100 with the substrate 400 disposed thereon may then travel through a first slit valve 1010 into the processing chamber 1006. Once the substrate carrier 100 is disposed in a processing position within the processing chamber 1006, the spray bar 1014 may translate across the substrate 400 retained to the substrate carrier 100 by the ESC 104. Once the substrate 400 has been processed, the substrate carrier 100 may travel through a second slit valve 1012 to a second vacuum and/or processing chamber, such as a second load lock chamber 1008. When the substrate 400 has been adequately processed, the substrate 400 may be dechucked from the substrate carrier 100.

Various aspects of the present invention may be implemented in hardware or software or in a combination of hardware and software. In one example, the control electronics 256 may comprise hardware and/or software. One embodiment may be implemented as a program product for use with a computer system which includes the control electronics 256. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are claimed embodiments of the disclosure.

Figure 11:
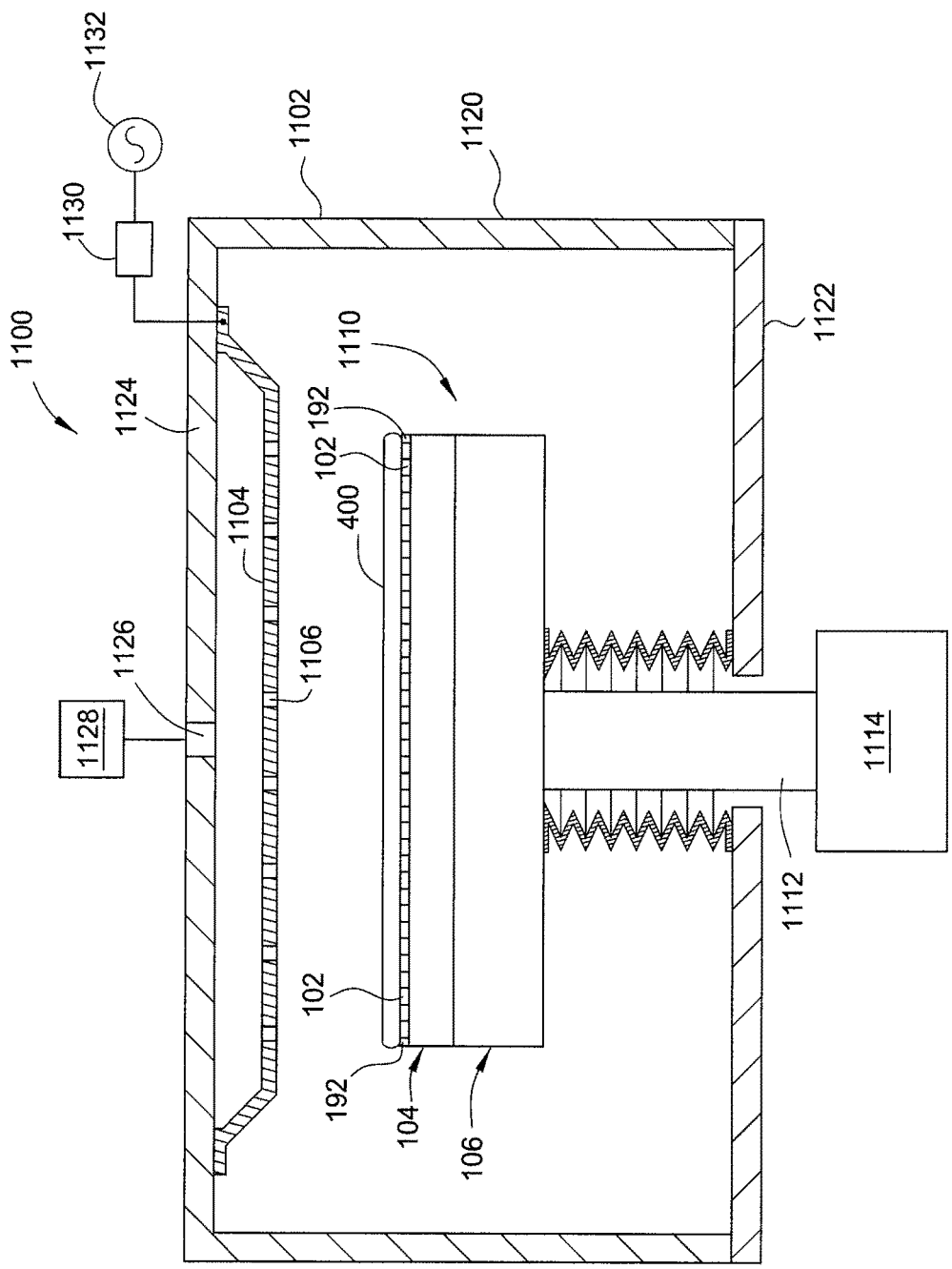
FIG. 11 is a sectional schematic view of another processing system utilizing a substrate support having an integrated ESC.

FIG. 11 is a sectional schematic view of another processing system 1100 utilizing a substrate support 1110 having an integrated ESC 104. The substrate support 1110 may also include a carrier body 106 on which the ESC 104 is mounted. The ESC 104 is generally configured as described above with reference to FIGS. 1-8. The carrier body 106 is also generally configured as described above with reference to FIGS. 1-8, except wherein the carrier body 106 of the substrate support 1110 is mounted within a single processing chamber 1102 of the processing system 1100, and the substrate 400 is robotically transferred to and from the substrate support 1110 through a sidewall 1120 of the processing chamber 1102.

In the exemplary processing system 1100 depicted in FIG. 11, the processing chamber 1102 includes sidewalls 1120, a bottom 1122 and a lid 1124. A showerhead 1104 is coupled to the lid 1124 above the substrate support 1110. The substrate support 1110 is coupled by a stem 1112 to a lift mechanism 1114 that controls the elevation of the substrate support 1110 within the processing chamber 1102 generally between a lower position to facilitate substrate transfer and a raised position for substrate processing.

A gas source 1128 is coupled to a port 1126 formed through the lid 1124 of the processing chamber 1102. Processing gas provided from the gas source 1128 and flowing through the port 1126 is distributed across the substrate 400 by holes 1106 formed through the showerhead 1104. The processing gas between the showerhead 1104 and substrate support 1110 is energized by power coupled to the showerhead 1104 through a matching circuit 1130 from a RF power source 1132. The energized gas is used to process the substrate 400, such as for example as described with reference to the processes described with reference to FIG. 10, among other processes.

Thus, a bipolar electrostatic chuck (ESC) suitable for use substrate carriers, substrate supports and the like, for securing substrates during processing has been described that includes a plurality of replaceable electrostatic chuck assemblies. Advantageously, each electrostatic chuck assembly may be independently replaced, thus reducing the time and cost to repair the ESC. Additionally, at least a first electrostatic chuck assembly of the plurality of electrostatic chuck assemblies is operable independent of an operation of a second electrostatic chuck assembly of the plurality of electrostatic chuck assemblies allowing some electrostatic chuck assemblies may be configured as spares to be utilized only when other electrostatic chuck assemblies fail, advantageously allowing the ESC to remain in service even after a number of electrostatic chuck assemblies fail.

Additionally, the improvements described herein are not limited to use with a particular type of ESC or other substrate support. For example, a substrate support or substrate carrier may be configured to include a seal circumscribing a substrate support surface. The substrate support surface includes a least one port for providing backside gas between the substrate and substrate support surface. The substrate support surface may optionally include plurality of electrostatic chuck assemblies. The seal is held in a cantilevered orientation that allows the seal to flex into contact with the substrate to retain backside gas between the substrate and substrate support surface upon application of gas below the seal. By controlling the pressure of the gas below the seal, the force of the seal against the substrate may be advantageously controlled.

In another example, a terminal connector is provided that includes a contact terminal encapsulated in an electrically insulating cover. A portion of the contact terminal is exposed through an opening in a top surface of the cover. The top surface of the cover further includes an outer ring that is disposed radially outward of the opening and an inner ring that is disposed radially inward of the opening. At least a portion of the insulating cover that includes the rings is fabricated from a resilient electrically insulating material. The resilient material allows the rings and cover to be compressed when mated against an insulating portion of a mating electrical connector when the contact terminal is in physical and electrical contact with a conductor of the electrical connector that is circumscribed by the rings. Thus, the rings, when compressed, advantageously isolate the electrical connection between the contact terminal and mating electrical connector in a manner that prevents arcing.

While the foregoing is directed to embodiments described herein, other and further embodiments may be devised without departing from the basic scope thereof, and the scope thereof is determined by the claims that follow.

What is claimed is:

1. An electrostatic chuck comprising:
    a chuck body; and
    a plurality of independently replaceable electrostatic chuck assemblies mounted in an array across the chuck body to define a substrate support surface suitable for supporting a large area substrate, at least a first electrostatic chuck assembly of the plurality of electrostatic chuck assemblies operable independent of an operation of a second electrostatic chuck assembly of the plurality of electrostatic chuck assemblies, wherein the first electrostatic chuck assembly is laterally spaced apart from the second electrostatic chuck assembly to form a gap therebetween, and wherein the chuck body comprises:
        a port aligned with and configured to flow gas into the gap defined between the first and second electrostatic chuck assemblies.

2. The electrostatic chuck of claim 1, wherein each electrostatic chuck assembly has at least two electrodes arranged in a bi-polar configuration.

3. The electrostatic chuck of claim 2, wherein the two electrodes comprise interleaving electrodes fingers.

4. An electrostatic chuck comprising:
    a chuck body; and
    a plurality of independently replaceable electrostatic chuck assemblies mounted in an array across the chuck body to define a substrate support surface suitable for supporting a large area substrate, at least a first electrostatic chuck assembly of the plurality of electrostatic chuck assemblies operable independent of an operation of a second electrostatic chuck assembly of the plurality of electrostatic chuck assemblies, wherein the plurality of electrostatic chuck assemblies have gaps defined therebetween configured to flow gas across the substrate support surface.

5. The electrostatic chuck of claim 1, wherein the chuck body comprises:
    conduits for flowing a heat transfer fluid within the chuck body.

6. The electrostatic chuck of claim 1 further comprising a seal circumscribing the electrostatic chuck assemblies, the seal configured to retain the gas across the electrostatic chuck assemblies.

7. The electrostatic chuck of claim 6, wherein the seal is operable to flex away from the chuck body.

8. The electrostatic chuck of claim 6, wherein the chuck body is disposed on a carrier body, the carrier body comprising:
    a recess across which the seal is supported in a cantilevered orientation, the seal is operable to flex away from the chuck body in response to a sufficient amount of the gas provided to the recess.

9. An electrostatic chuck comprising:
    a chuck body;

a plurality of independently replaceable electrostatic chuck assemblies mounted in an array across the chuck body to define a substrate support surface suitable for supporting a large area substrate, at least a first electrostatic chuck assembly of the plurality of electrostatic chuck assemblies operable independent of an operation of a second electrostatic chuck assembly of the plurality of electrostatic chuck assemblies, wherein each electrostatic chuck assembly comprises:

a main body having at least a first electrode disposed therein; and at least a first tab extending from the main body and through the chuck body, the first tab comprising a connection terminal coupled to the first electrode, the connection terminal sandwiched between insulating layers;

a first electrical lead electrically coupled to the connection terminal disposed in the first tab, the first electrical lead separated from the main body by a carrier body; and a terminal connector comprising a contact terminal encapsulated in an electrically insulating cover, a portion of the contact terminal exposed through an opening in a top surface of the cover, the top surface of the cover further comprising an outer ring disposed radially outward of the opening and an inner ring disposed radially inward of the opening.

10. The electrostatic chuck of claim 9, wherein the inner ring and the outer ring are sealingly compressed against the first tab when an exposed portion of the contact terminal is in physical and electrical contact with the connection terminal disposed in the first tab.

11. The electrostatic chuck of claim 1, wherein the chuck body is coupled to a stem.

12. The electrostatic chuck of claim 1, wherein the chuck body is adapted to be transported between processing chambers of a processing system while having a substrate secured thereto.

13. A method for chucking a substrate, comprising:

disposing a large area substrate against a substrate support surface of an electrostatic chuck comprising a plurality of independently replaceable independently energizable bi-polar electrostatic chuck assemblies;

energizing at least a first group of the bi-polar electrostatic chuck assemblies to secure the substrate to the substrate support surface;

providing a backside gas between the substrate and the substrate support surface;

applying pressure below a seal secured in a cantilevered orientation and circumscribing the bi-polar electrostatic chuck assemblies, the pressure flexing the seal into contact with the substrate;

not applying power to at least a second group of the bi-polar electrostatic chuck assemblies while the substrate is secured to the substrate support surface by the first group;

determining at least one of the bi-polar electrostatic chuck assemblies in the first group have failed; and energizing at least one or more of the bi-polar electrostatic chuck assemblies of the second group with the first group to secure another substrate to the electrostatic chuck.

14. The method of claim 13 further comprising:

transporting the substrate while secured to the substrate support surface out of a processing chamber.

15. The method of claim 13 further comprising:

elevating the substrate while secured to the substrate support surface within a processing chamber.

16. The electrostatic chuck of claim 1 further comprising:

a controller on-board the electrostatic chuck, the controller configured to receive communications originating remote from the chuck body.

17. The electrostatic chuck of claim 16, wherein the controller is configured to control chucking and de-chucking of a substrate from the chuck body in response to the received communications.

18. The electrostatic chuck of claim 16 further comprising:

a sensor remote from the chuck body, the sensor in communication with the controller on-board the electrostatic chuck, the controller configured to receive communications originating outside the chuck body.

19. The electrostatic chuck of claim 16, wherein the controller is configured to communicate with a power source remote from the chuck body.

20. The electrostatic chuck of claim 19, wherein the power source is a battery.

* * * * *

UNITED STATES PATENT AND TRADEMARK OFFICE
CERTIFICATE OF CORRECTION

PATENT NO. : 10,460,969 B2
APPLICATION NO. : 15/461948
DATED : October 29, 2019
INVENTOR(S) : John M. White et al.

Page 1 of 1

It is certified that error appears in the above-identified patent and that said Letters Patent is hereby corrected as shown below:

In the Specification

In Column 1, Line 8, delete "Aug. 8," and insert -- Aug. 22, --, therefor.

In Column 1, Line 25, delete "The a" and insert -- The --, therefor.

In Column 4, Line 37, delete "2-dimential" and insert -- 2-dimensional --, therefor.

Signed and Sealed this
Thirty-first Day of December, 2019

Andrei Iancu
*Director of the United States Patent and Trademark Office*